(12) United States Patent
Byun et al.

(10) Patent No.: US 10,484,132 B2
(45) Date of Patent: Nov. 19, 2019

(54) METHOD FOR ENCODING BASED ON PARITY CHECK MATRIX OF LDPC CODE IN WIRELESS COMMUNICATION SYSTEM AND TERMINAL USING THIS

(71) Applicant: LG Electronics Inc., Seoul (KR)

(72) Inventors: Ilmu Byun, Seoul (KR); Jongwoong Shin, Seoul (KR); Jinwoo Kim, Seoul (KR); Kwangseok Noh, Seoul (KR); Bonghoe Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/247,090

(22) Filed: Jan. 14, 2019

(65) Prior Publication Data

US 2019/0268092 A1 Aug. 29, 2019

Related U.S. Application Data

(63) Continuation of application No. PCT/KR2018/003798, filed on Mar. 30, 2018.

(60) Provisional application No. 62/525,219, filed on Jun. 27, 2017, provisional application No. 62/479,420, filed on Mar. 31, 2017, provisional application No. 62/479,253, filed on Mar. 30, 2017.

(51) Int. Cl.
*H03M 13/00* (2006.01)
*H04L 1/00* (2006.01)
*H03M 13/11* (2006.01)

(52) U.S. Cl.
CPC ....... *H04L 1/0045* (2013.01); *H03M 13/1102* (2013.01); *H03M 13/616* (2013.01)

(58) Field of Classification Search
CPC ........... H04L 1/0045; H03M 13/1102; H03M 13/616
See application file for complete search history.

(56) References Cited

U.S. PATENT DOCUMENTS 7,430,215 B2 * 9/2008 Arivoli ............. H03M 13/2707
370/204
8,151,157 B2 * 4/2012 Lee ..................... H03M 13/116
714/749

(Continued)

FOREIGN PATENT DOCUMENTS

KR 101128804 3/2012

OTHER PUBLICATIONS

Mediatek Inc., "A multi-codebook embedded compact QC-LDPC design," 3GPP TSG-RAN WG1 NR, Apr. 3-7, 2017.

(Continued)

*Primary Examiner* — Esaw T Abraham
(74) *Attorney, Agent, or Firm* — Fish & Richardson P.C.

(57) ABSTRACT

A method for performing encoding on the basis of a parity check matrix of a low density parity check code according to the present embodiment comprises the steps of: generating a parity check matrix by a terminal, wherein the parity check matrix corresponds to a characteristic matrix, each component of the characteristic matrix corresponds to a shift index value determined through a modulo operation between a corresponding component in a basic matrix and Zc, which is a lifting value, and the basic matrix is a 42×52 matrix; and performing encoding of input data, by the terminal, using the parity check matrix, wherein the lifting value is associated with the length of the input data.

20 Claims, 14 Drawing Sheets

(56) References Cited

U.S. PATENT DOCUMENTS

| | | | | |
|---|---|---|---|---|
| 8,190,979 | B2* | 5/2012 | Song | H04L 1/0041 |
| | | | | 714/784 |
| 8,356,227 | B2* | 1/2013 | Chung | H03M 13/116 |
| | | | | 714/749 |
| 8,837,618 | B2* | 9/2014 | Petrov | H03M 13/1165 |
| | | | | 375/261 |
| 9,362,952 | B2* | 6/2016 | Myung | H03M 13/1165 |
| 9,584,158 | B2* | 2/2017 | Wu | H03M 13/116 |
| 2003/0140300 | A1* | 7/2003 | Chen | G06F 11/1016 |
| | | | | 714/763 |
| 2007/0011570 | A1* | 1/2007 | Jeong | H03M 13/116 |
| | | | | 714/758 |

OTHER PUBLICATIONS

Ericsson., "Design Considerations for Smaller LDPC Codes," 3GPP TSG RAN WG1 Meeting #88bis, Apr. 3-7, 2017.
Ericsson, "LDPC Code Design for eMBB," 3GPP TSG RAN WG1 Meeting #88bis, Apr. 3-7, 2017.
Samsung, "Performance evaluation of LDPC Code," 3GPP TSG RAN WG1 #88bis, Apr. 3-7, 2017.
Ericsson, "Code Block Segmentation for LDPC Codes," 3GPP TSG RAN WG1 Meeting #88bis, Apr. 3-7, 2017.

* cited by examiner

FIG. 2

$$P_{\sim 1} = \begin{bmatrix} 0 & 1 & 0 & \cdots & 0 \\ 0 & 0 & 1 & & 0 \\ \vdots & & & \ddots & \vdots \\ 0 & 0 & 0 & \cdots & 1 \\ 1 & 0 & 0 & & 0 \end{bmatrix}$$

FIG. 3

$$H = \begin{bmatrix} P\_a\ 1,1 & P\_a\ 1,2 & \cdots & P\_a\ 1,(n-1) & P\_a\ 1,n \\ P\_a\ 2,1 & P\_a\ 2,2 & & P\_a\ 2,(n-1) & P\_a\ 2,n \\ \vdots & & \ddots & & \vdots \\ P\_a\ m,1 & P\_a\ m,2 & \cdots & P\_a\ m,(n-1) & P\_a\ m,n \end{bmatrix}$$

FIG. 4

$$H_C = \begin{bmatrix} a\,1,1 & a\,1,2 & \cdots & a\,1,(n-1) & a\,1,n \\ a\,2,1 & a\,2,2 & & a\,2,(n-1) & a\,2,n \\ \vdots & \vdots & \ddots & & \vdots \\ a\,m,1 & a\,m,2 & \cdots & a\,m,(n-1) & a\,m,n \end{bmatrix}$$

FIG. 5

$$H_b = \begin{bmatrix} \underline{A} & \underline{B} \\ \underline{C} & \underline{D} \end{bmatrix}$$

METHOD FOR ENCODING BASED ON PARITY CHECK MATRIX OF LDPC CODE IN WIRELESS COMMUNICATION SYSTEM AND TERMINAL USING THIS

CROSS-REFERENCE TO RELATED APPLICATIONS

Pursuant to 35 U.S.C. § 119(e), this application is a continuation of International Application PCT/KR2018/003798, with an international filing date of Mar. 30, 2018, which claims the benefit of U.S. Provisional Patent Applications Nos. 62/525,219 filed on Jun. 27, 2017, 62/479,420 filed on Mar. 31, 2017, and 62/479,253 filed on Mar. 30, 2017, the contents of which are hereby incorporated by reference herein in its entirety.

TECHNICAL FIELD

The present disclosure relates to wireless communication and, more particularly, to a method of performing encoding based on a parity check matrix of an LDPC code in a wireless communication system and a user equipment using the same.

BACKGROUND ART

A conventional low-density parity-check (LDPC) encoding method has been used in wireless communication systems such as an IEEE 802.11n wireless local area network (WLAN) system, an IEEE 802.16e mobile WiMAX system, and a DVB-S2 system. The LDPC encoding method is basically a type of linear block code and, therefore, operation of the LDPC encoding method is performed by multiplication of a parity check matrix by an input vector.

It is predicted that data transmission for fifth generation (5G) communication will support from a maximum of 20 Gbps to a minimum of a few tens of bps (e.g., 40 bits in the case of LTE). In other words, to support wide coverage of data transmission, it is necessary to support various code rates. To meet such a requirement, various encoding methods based on an LDPC code are under discussion.

DETAILED DESCRIPTION OF THE INVENTION

Technical Problems

An object of the present disclosure is to provide a method of performing encoding and a user equipment using the same, based on a parity check matrix of an LDPC code which is favorable in terms of latency in transmission of a short block with a relatively short length.

Technical Solutions

According to an aspect of the present disclosure, provided herein is a method of performing encoding based on a parity check matrix of a low-density parity-check (LDPC) code, including generating the parity check matrix by a user equipment, wherein the parity check matrix corresponds to a characteristic matrix, each element of the characteristic matrix corresponds to a shift index value determined by a modulo operation between a corresponding element in a base matrix and a lifting value $Z_c$, and the base matrix is a 42×52 matrix; and performing encoding on input data using the parity check matrix by the user equipment, wherein the lifting value is associated with the length of the input data.

Advantageous Effects

According to an embodiment of the present disclosure, there are provided a method of performing encoding and a user equipment using the same, based on a parity check matrix of an LDPC code which is favorable in terms of latency in transmission of a short block with a relatively short length.

DESCRIPTION OF DRAWINGS

FIG. 2 is a diagram referenced to explain characteristics of a submatrix P.

FIG. 3 is a diagram illustrating a parity check matrix according to an embodiment of the present disclosure.

FIG. 4 is a diagram illustrating a characteristic matrix corresponding to a parity check matrix according to an embodiment of the present disclosure.

FIG. 5 is a diagram illustrating the structure of a base matrix for a parity check matrix according to an embodiment of the present disclosure.

FIG. 6 illustrates a matrix A belonging to a base matrix according to an embodiment of the present disclosure.

FIGS. 7A and 7B illustrate a matrix C belonging to a base matrix according to an embodiment of the present disclosure.

BEST MODE FOR CARRYING OUT THE INVENTION

The above-described characteristics and the following detailed description are merely exemplary details that are given to facilitate the description and understanding of this disclosure. More specifically, this disclosure may be implemented in another format without being restricted only to the exemplary embodiment presented herein. The following exemplary embodiments are merely examples that are given to fully disclose this disclosure and to describe this disclosure to anyone skilled in the technical field to which this disclosure pertains. Accordingly, if plural methods for implementing the elements of the present disclosure exist, it should be clarified that this disclosure can be implemented by any one specific or similar method.

In this disclosure, if a structure is described as including specific elements, or if a procedure is described as including specific process steps, this indicates that other elements or other process steps may be further included. More specifically, it will be apparent that the terms used in this disclosure are merely given to describe a specific exemplary embodiment of the present disclosure and that such terms will not be used to limit the concept or idea of this disclosure. Furthermore, it will also be apparent that the examples given to facilitate the understanding of the invention also include complementary embodiments of the given examples.

Each of the terms used in this disclosure is given a meaning that can be generally understood by anyone skilled in the technical field to which this disclosure pertains. Each of the terms that are generally used herein should be understood and interpreted by its uniform meaning in accordance with the context of this disclosure. Moreover, the terms used in this disclosure should not be interpreted as excessively ideal or formal meaning unless otherwise defined clearly. The appended drawings are given to describe the exemplary embodiment of this disclosure.

Figure 1:
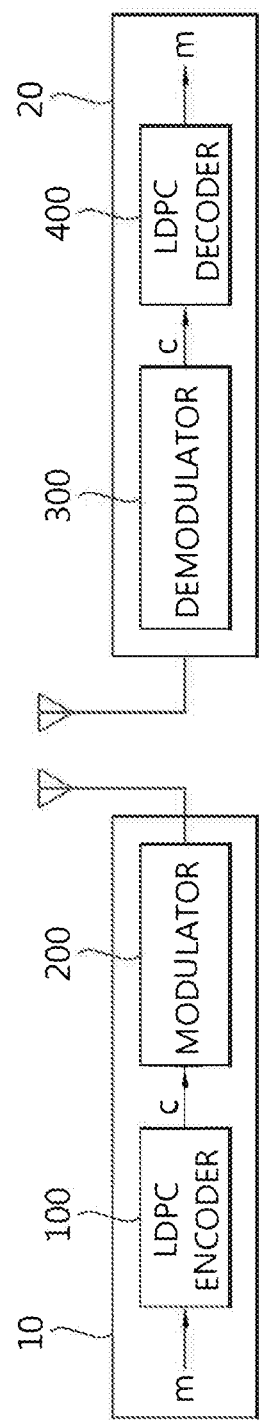
FIG. 1 is a block diagram of a wireless communication system according to an embodiment of the present disclosure.

FIG. 1 is a block diagram of a wireless communication system according to an embodiment of the present disclosure.

Referring to FIG. 1, the wireless communication system may include a transmission user equipment (UE) 10 and a reception UE 20.

The transmission UE 10 may include an LDPC encoder 100 and a modulator 200. The LDPC encoder 100 may receive data m, encode the received data m, and output a codeword c. The modulator 200 may receive the codeword c and perform radio modulation on the received codeword c. The radio modulated codeword may be transmitted to the reception UE 20 through an antenna.

It may be appreciated that a processor (not shown) of the transmission UE 10 includes the LDPC encoder 100 and the modulator 200 and is connected to the antenna of the transmission UE 10.

The reception UE 20 may include a demodulator 300 and an LDPC decoder 400. The demodulator 300 may receive the radio modulated codeword through an antenna and demodulate the radio modulated codeword into the codeword c. The LDPC decoder 400 may receive the codeword c, decode the codeword c, and output the data m.

It may be appreciated that a processor (not shown) of the reception UE 20 includes the demodulator 300 and the LDPC decoder 400 and is connected to the antenna of the reception UE 20.

In other words, the wireless communication system of FIG. 1 may encode the data m into the codeword c using the LDPC encoder 100 and decode the codeword c into the data m using the LDPC decoder 400.

Thereby, the data may be stably transmitted and received between the transmission UE 10 and the reception UE 20. An LDPC encoding method and decoding method according to the present embodiment may be performed based on a parity check matrix H.

In the present disclosure, the data m may be referred to as input data. The parity check matrix H may represent a matrix for checking whether an error is included in the codeword c received by the LDPC decoder 400. The parity check matrix H may be prestored in a memory (not shown) of each of the transmission UE 10 and the reception UE 20.

Hereinafter, embodiments of the present disclosure will be described on the premise that a quasi-cyclic LDPC code is applied. The parity check matrix H may include a plurality of submatrices P. Each submatrix P may be a zero matrix 0, or a circulant matrix acquired by shifting an identity matrix I.

To encode data from a general linear block code, a generate matrix G is needed. According to the above assumption, since the present embodiment is based on a quasi-cyclic LDPC method, the LDPC encoder 100 may encode the data m into the codeword c using the parity check matrix H without an additional generate matrix G.

The LDPC encoder 100 may encode the data m into the codeword c using the parity check matrix H.

$$c=[m\ p] \quad \text{Equation 1}$$

Referring to Equation 1, the codeword c generated by the LDPC encoder 100 may be divided into the data m and a parity bit p.

For example, the data m may correspond to a set of binary data $[m\_0, m\_1, m\_2, \ldots, m\_K-1]$. That is, it may be understood that the length of the data m to be encoded is K.

For example, the parity bit p may correspond to a set of binary data $[p\_0, p\_1, p\_2, \ldots p\ N+2Zc-K-1]$. That is, it may be understood that the length of the parity bit p is $N+2Zc-K$. In this case, N may be 50Zc (i.e., N=50Zc). Zc will be described later in detail with reference to the drawings.

From the viewpoint of the LDPC encoder 100, the parity bit p for encoding the data m may be derived using the parity check matrix H.

Additionally, it may be assumed that, on a channel coding chain, initial data of a transport block size (hereinafter, 'TBS') exceeding a preset threshold size (i.e., Kcb, for example, 8448 bits) is received from a higher layer.

In this case, the initial data may be divided into at least two data depending on the length K of data (where K is a natural number) to be encoded. In other words, the length K of the data m may be understood as a code block size (CBS).

It may be understood that the parity check matrix H according to the embodiment of the present disclosure is applied when the CBS does not exceed a predetermined threshold value (e.g., 2040 bits).

Meanwhile, the LDPC decoder 400 may determine whether an error is present in the received codeword c based on the parity check matrix H. Whether an error is present in the received codeword c may be checked by the LDPC decoder 400 based on Equation 2.

$$H \cdot c^T = 0 \quad \text{Equation 2}$$

As indicated in Equation 2, when multiplication of the parity check matrix H by a transposed matrix of the codeword c is '0', the codeword c received by the reception UE 20 may be determined not to include an error value.

When the multiplication of the parity check matrix H by the transposed matrix of the codeword c is not '0', the codeword c received by the reception UE 20 may be determined to include an error value.

FIG. 2 is a diagram referenced to explain characteristics of a submatrix P. Referring to FIGS. 1 and 2, the parity check matrix H may include a plurality of submatrices $P\_y$ (where y is an integer). In this case, it may be appreciated that each submatrix $P\_y$ is a matrix acquired by shifting an identity matrix I having a size of Zc×Zc to the right by a specific value y.

Specifically, since the subscript y of a submatrix $P\_1$ of FIG. 2 is '1', the submatrix $P\_1$ may be understood as a matrix obtained by shifting all elements included in the identity matrix I having a size of Zc×Zc to the right by one column. In this disclosure, Zc may be referred to as a lifting value.

Although not shown in FIG. 2, since the subscript y of a submatrix P_0 is '0', the submatrix P_0 may be understood as the identity matrix I having a size of Zc×Zc.

In addition, since the subscript y of a submatrix P_−1 is '−1', the submatrix P_−1 may be understood as a zero matrix having a size of Zc×Zc.

FIG. 3 is a diagram illustrating a parity check matrix according to an embodiment of the present disclosure.

Referring to FIGS. 1 to 3, one submatrix P_am,n may be defined at every location m,n by each row m (where m is a natural number of 1 to 42) and each column n (where n is a natural number of 1 to 52) of the parity check matrix H of FIG. 3.

The subscript (i.e., am,n) corresponding to the defined location m,n of the parity check matrix H of FIG. 3 is set to an integer value and may be referred to as a shift index value.

Each submatrix P_am,n of FIG. 3 may be understood as a matrix obtained by shifting the identity matrix I having a size of Zc×Zc to the right by the shift index value am,n corresponding to the location (m,n). That is, an actual size of the parity check matrix H of FIG. 3 may be understood as (m×Zc)×(n×Zc).

For example, the lifting value Zc according to the present embodiment may be nay one of 15, 30, 60, 120, and 240. As another example, the lift value Zc may be any one of 3, 6, 12, 24, 48, 96, 192, and 384.

FIG. 4 is a diagram illustrating a characteristic matrix corresponding to a parity check matrix according to an embodiment of the present disclosure.

Referring to FIGS. 1 to 4, elements (i.e., a1,1 to am,n) according to the location m,n determined by each row m (where m is a natural number of 1 to 42) and each column n (where n is a natural number of 1 to 52) of the characteristic matrix Hc of FIG. 4 may be set as shift index values at corresponding locations of the parity check matrix H of FIG. 3.

That is, the parity check matrix H of FIG. 3 may be obtained by the elements according to the location m,n of the characteristic matrix Hc of FIG. 4 and the preset lifting value Zc.

The element am,n of the characteristic matrix Hc of FIG. 4 may be defined as indicated below in Equation 3.

Equation 3

$$a_{m,n} = \begin{cases} V_{m,n} & \text{if } V_{m,n} < 0 \\ \mod(V_{m,n}, Z_c), & \text{otherwise} \end{cases} \quad \text{Equation 3}$$

The lifting value Zc of Equation 3 may be any one of 15, 30, 60, 120, and 240. As another example, the lifting value Zc may be any one of 3, 6, 12, 24, 48, 96, 192, and 384.

In Equation 3, Vm,n may be an element of a corresponding location m,n in a base matrix (hereinafter 'fib') which will be described later.

For example, it may be assumed that the shift index value am,n corresponding to the location m,n of the parity check matrix H, obtained by Equation 3, is equal to or greater than '1'.

In this case, the submatrix P_am,n corresponding to the location m,n of FIG. 3 may be understood as a matrix obtained by shifting all elements included in the identity matrix I having a size of Zc×Zc (where Zc is a natural number) to the right by the shift index value (i.e., am,n) corresponding to the location (m,n) of FIG. 3.

As another example, it may be assumed that the shift index value am,n corresponding to the location m,n of the parity check matrix H, obtained by Equation 3, is '0'.

In this case, the submatrix P_am,n corresponding to the location m,n of FIG. 3 may maintain the identity matrix I having a size of Zc×Zc (where Zc is a natural number).

As still another example, it may be assumed that the shift index value am,n corresponding to the location m,n of the parity check matrix H, obtained by Equation 3, is '−1'.

In this case, the submatrix P_am,n corresponding to the location m,n of FIG. 3 may be replaced with a zero matrix having a size of Zc×Zc.

FIG. 5 is a diagram illustrating the structure of a base matrix for a parity check matrix according to an embodiment of the present disclosure.

Referring to FIGS. 1 to 5, the parity check matrix H of FIG. 3 may be generated based on the characteristic matrix Hc of FIG. 4 and the lifting value Zc. The characteristic matrix Hc of FIG. 4 may be acquired through operation of Equation 3 based on the base matrix Hb of FIG. 5 and the lifting value Zc.

Referring to FIGS. 1 to 5, the base matrix Hb of FIG. 3 according to the present embodiment may include 4 submatrices A, B, C, and D.

The size of the base matrix Hb according to the present embodiment may be 42×52. A predetermined element Vm,n may be disposed at every location m,n defined by each row m (where m is a natural number of 1 to 42) and each column n (where n is a natural number of 1 to 52) of the base matrix Hb.

The matrix A of FIG. 5 may include a plurality of elements corresponding to 1st to 17th columns of the base matrix Hb in 1st to 7th rows of the base matrix Hb. The matrix A will be described later in detail with reference to FIG. 6.

The matrix B of FIG. 5 may include elements corresponding to 18th to 52nd columns of the base matrix Hb in the 1st to 7th rows of the base matrix Hb, which are all '−1'.

The matrix C of FIG. 5 may include a plurality of elements corresponding to the 1st to 17th columns of the base matrix Hb in 8th to 42nd rows of the base matrix Hb. The matrix C will be described later in detail with reference to FIGS. 7A and 7B.

The matrix D of FIG. 5 may include a plurality of elements corresponding to the 18th to 52nd columns of the base matrix Hb in the 8th to 42nd rows of the base matrix Hb. The matrix D will be described later in detail with reference to FIGS. 8A and 8B.

In addition, elements corresponding to a plurality of specific predetermined columns of the base matrix Hb may be punctured. For example, elements corresponding to the 1st and 2nd columns of the base matrix Hb may be punctured.

Hereinafter, respective elements Vm,n of the matrices A, B, C, and D included in the base matrix Hb will be described in detail with reference to subsequent drawings.

Figure 6:
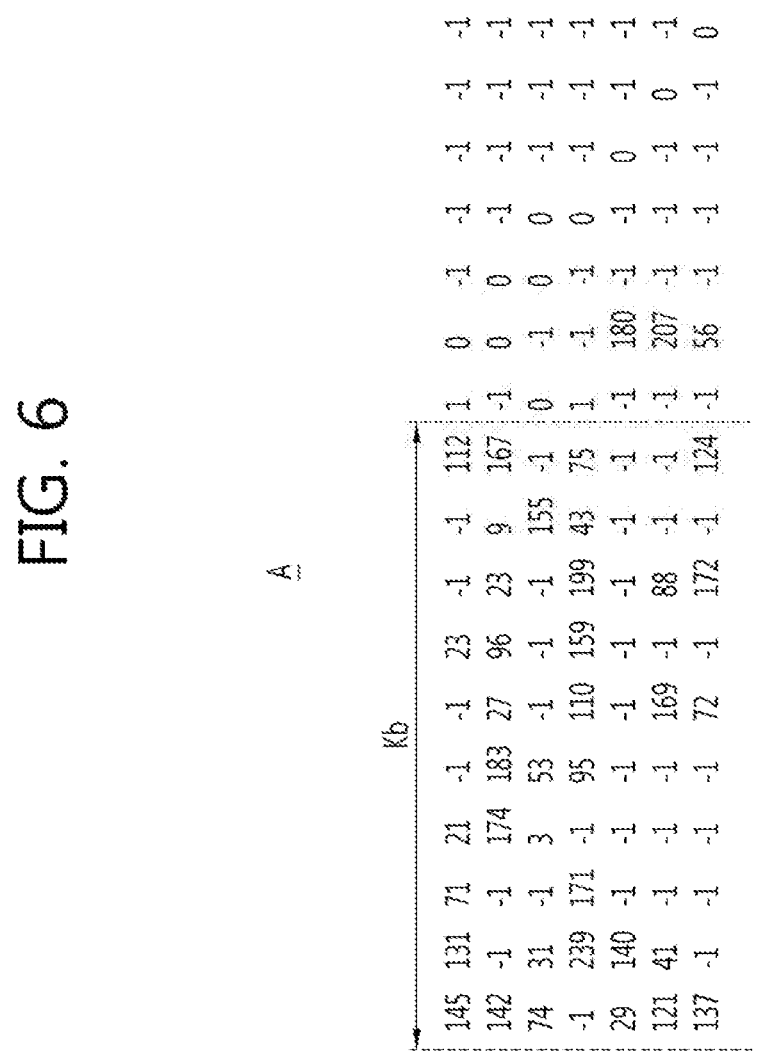

FIG. 6 illustrates a matrix A included in a base matrix according to an embodiment of the present disclosure.

Referring to FIGS. 1 to 6, elements Vm,n defined by the 1st row (m=1) and 1st to 17th columns (n=1, . . . , 17) of the matrix A belonging to the base matrix Hb may be {145,131, 71,21,−1,−1,23,−1,−1,112,1,0,−1,−1,−1,−1,−1}.

Elements Vm,n defined by the 2nd row (m=2) and the 1st to 17th columns (n=1, . . . , 17) of the matrix A belonging to the base matrix Hb may be {142,−1,−1,174,183,27,96, 23,9,167,−1,0,0,−1,−1,−1,−1}.

Elements Vm,n defined by the 3rd row (m=3) and the 1st to 17th columns (n=1, ..., 17) of the matrix A belonging to the base matrix Hb may be {74,31,−1,3,53,−1,−1,−1, 155,−1,0,−1,0,0,−1,−1,−1}.

Elements Vm,n defined by the 4th row (m=4) and the 1st to 17th columns (n=1, ..., 17) of the matrix A belonging to the base matrix Hb may be {−1,239,171,−1,95,110,159, 199,43,75,1,−1,−1,0,−1,−1,−1}.

Elements Vm,n defined by the 5th row (m=5) and the 1st to 17th columns (n=1, ..., 17) of the matrix A belonging to the base matrix Hb may be {29,140,−1,−1,−1,−1,−1,−1,−1, 1,−1,−1,180,−1,−1,0,−1,−1}.

Elements Vm,n defined by the 6th row (m=6) and the 1st to 17th columns (n=1, ..., 17) of the matrix A belonging to the base matrix Hb may be {121,41,−1,−1,−1,169,−1,88,− 1,−1,−1,207,−1,−1,−1,0,−1}.

Elements Vm,n defined by the 7th row (m=7) and the 1st to 17th columns (n=1, ..., 17) of the matrix A belonging to the base matrix Hb may be {137,−1,−1,−1,−1,72,−1,172,− 1,124,−1,56,−1,−1,−1,−1,0}.

Referring to FIG. 6, a set of columns corresponding to the 1st to 10th columns (n=1, ... 10) of the matrix A may be referred to as information columns. A maximum value for information columns Kb of the base matrix Hb according to the present embodiment may be '10'. That is, the number Kb of information columns of the base matrix Hb may be variably defined according to a TBS B of initial data received from a higher layer.

The number Kb of information columns may be associated with the length K of input data (e.g., m in FIG. 1) to be encoded and the lifting value Zc as indicated in Equation 4.

According to the embodiment of FIG. 6, the lifting value Zc of Equation 4 may be any one of 15, 30, 60, 120, and 240. In the present disclosure, the lifting value Zc may be a value commonly used in the base matrix Hb.

$Zc = K/Kb$          Equation 4

Referring to Equation 4, a maximum information bit value K of the input data (m in FIG. 1) which is encoded (or can be encoded) based on the parity check matrix according to the present disclosure may be 150, 300, 600, 1200, or 2400.

In addition, unlike the embodiment of FIG. 6, the lifting value Zc may be any one of 3, 6, 12, 24, 48, 96, 192, and 384. In this case, the maximum information bit value K of the input data (m in FIG. 1) which is encoded (or can be encoded) based on the parity check matrix may be 30, 60, 120, 240, 480, 960, 1920, or 3840.

For reference, the 7×17 matrix A of FIG. 6 according to the present embodiment may be as indicated in Table 1.

base matrix Hb in the 8th row (m=8) of the matrix C belonging to the base matrix Hb may be {−1,86,−1,−1,−1, 186,−1,87,−1,−1,−1,172,−1,154,−1,−1,−1}.

Elements Vm,n corresponding to the 1st to 17th columns (n=1, ..., 17) of the base matrix Hb in the 9th row (m=9) of the matrix C belonging to the base matrix Hb may be {176,169,−1,−1,−1,−1,−1,−1,−1,−1,−1,−1,225,−1,−1,−1,− 1}.

Elements Vm,n corresponding to the 1st to 17th columns (n=1, ..., 17) of the base matrix Hb in the 10th row (m=10) of the matrix C belonging to the base matrix Hb may be {−1,167,−1,−1,−1,−1,−1,−1,238,−1,48,68,−1,−1,−1,−1,−1}.

Elements Vm,n corresponding to the 1st to 17th columns (n=1, ..., 17) of the base matrix Hb in the 11th row (m=11) of the matrix C belonging to the base matrix Hb may be {38,217,−1,−1,−1,−1,208,232,−1,−1,−1,−1,−1,−1,−1,−1,− 1}.

Elements Vm,n corresponding to the 1st to 17th columns (n=1, ..., 17) of the base matrix Hb in the 12th row (m=12) of the matrix C belonging to the base matrix Hb may be {178,−1,−1,−1,−1,−1,−1,214,−1,168,−1,−1,−1,51,−1,−1,− 1}.

Elements Vm,n corresponding to the 1st to 17th columns (n=1, ..., 17) of the base matrix Hb in the 13th row (m=13) of the matrix C belonging to the base matrix Hb may be {−1,124,−1,122,−1,−1,−1,−1,−1,−1,−1,72,−1,−1,−1,−1,−1}.

Elements Vm,n corresponding to the 1st to 17th columns (n=1, ..., 17) of the base matrix Hb in the 14th row (m=14) of the matrix C belonging to the base matrix Hb may be {48,57,−1,−1,−1,−1,−1,−1,167,−1,−1,−1,−1,219,−1,−1,−1}.

Elements Vm,n corresponding to the 1st to 17th columns (n=1, ..., 17) of the base matrix Hb in the 15th row (m=15) of the matrix C belonging to the base matrix Hb may be {−1,82,−1,−1,−1,−1,232,−1,−1,−1,−1,204,−1,162,−1,−1,− 1}.

Elements Vm,n corresponding to the 1st to 17th columns (n=1, ..., 17) of the base matrix Hb in the 16th row (m=16) of the matrix C belonging to the base matrix Hb may be {38,−1,−1,−1,−1,−1,−1,−1,−1,−1,217,157,−1,−1,−1,−1,−1}.

Elements Vm,n corresponding to the 1st to 17th columns (n=1, ..., 17) of the base matrix Hb in the 17th row (m=17) of the matrix C belonging to the base matrix Hb may be {−1,170,−1,−1,−1,−1,−1,−1,−1,−1,23,−1,175,202,−1,−1,− 1}.

Elements Vm,n corresponding to the 1st to 17th columns (n=1, ..., 17) of the base matrix Hb in the 18th row (m=18) of the matrix C belonging to the base matrix Hb may be {−1,196,−1,−1,−1,173,−1,−1,−1,−1,−1,195,218,−1,−1,−1,− 1}.

Elements Vm,n corresponding to the 1st to 17th columns (n=1, ..., 17) of the base matrix Hb in the 19th row (m=19)

TABLE 1

| 145 | 131 | 71 | 21 | −1 | −1 | 23 | −1 | −1 | 112 | 1 | 0 | −1 | −1 | −1 | −1 | −1 |
|---|---|---|---|---|---|---|---|---|---|---|---|---|---|---|---|---|
| 142 | −1 | −1 | 174 | 183 | 27 | 96 | 23 | 9 | 167 | −1 | 0 | 0 | −1 | −1 | −1 | −1 |
| 74 | 31 | −1 | 3 | 53 | −1 | −1 | −1 | 155 | −1 | 0 | −1 | 0 | 0 | −1 | −1 | −1 |
| −1 | 239 | 171 | −1 | 95 | 110 | 159 | 199 | 43 | 75 | 1 | −1 | −1 | 0 | −1 | −1 | −1 |
| 29 | 140 | −1 | −1 | −1 | −1 | −1 | −1 | −1 | −1 | −1 | 180 | −1 | −1 | 0 | −1 | −1 |
| 121 | 41 | −1 | −1 | −1 | 169 | −1 | 88 | −1 | −1 | −1 | 207 | −1 | −1 | −1 | 0 | −1 |
| 137 | −1 | −1 | −1 | −1 | 72 | −1 | 172 | −1 | 124 | −1 | 56 | −1 | −1 | −1 | −1 | 0 |

Figure 7A:
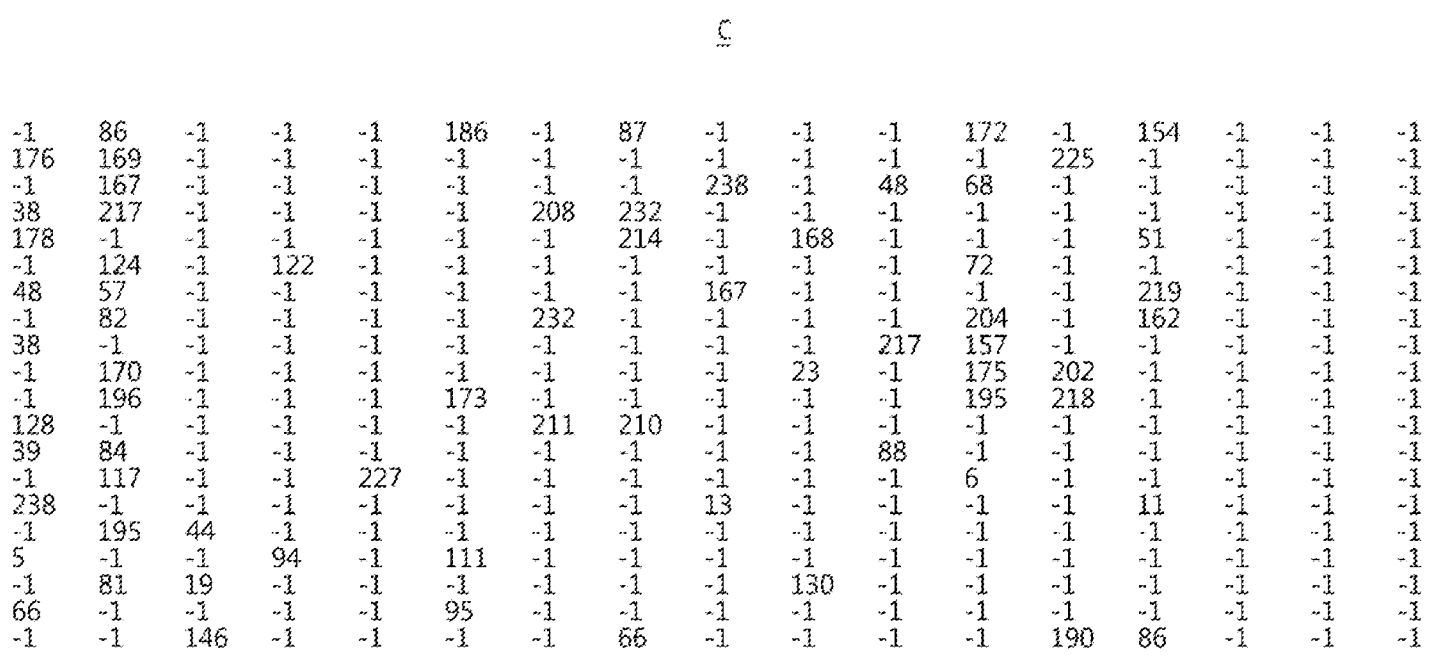
Figure 7B:
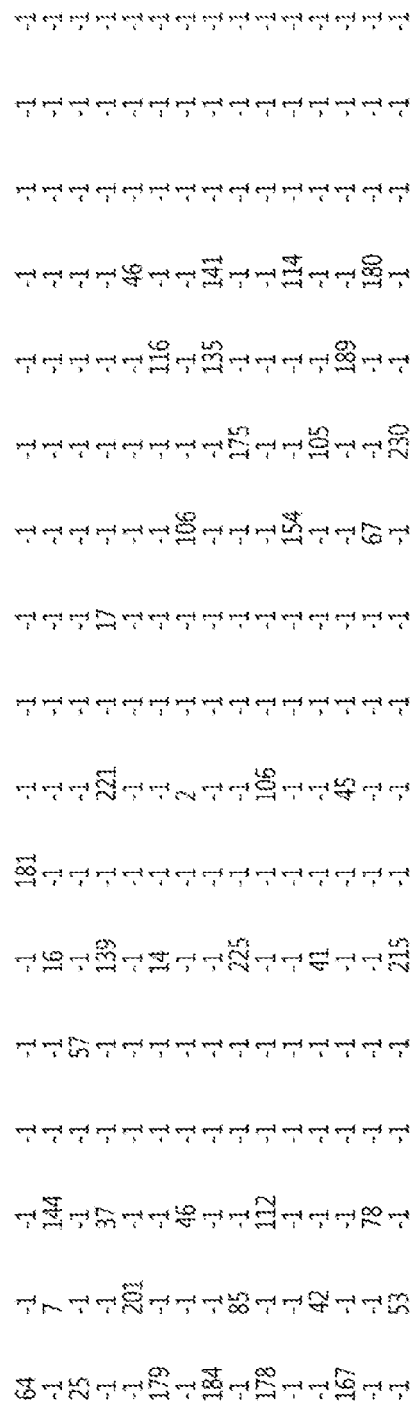

FIGS. 7A and 7B illustrate a matrix C belonging to a base matrix according to an embodiment of the present disclosure.

Referring to FIGS. 1 to 6 and 7A, elements Vm,n corresponding to the 1st to 17th columns (n=1, ..., 17) of the of the matrix C belonging to the base matrix Hb may be {128,−1,−1,−1,−1,−1,211,210,−1,−1,−1,−1,−1,−1,−1,−1,− 1}.

Elements Vm,n corresponding to the 1st to 17th columns (n=1, ..., 17) of the base matrix Hb in the 20th row (m=20)

of the matrix C belonging to the base matrix Hb may be {39,84,−1,−1,−1,−1,−1,−1,−1,−1,88,−1,−1,−1,−1,−1,−1}.

Elements Vm,n corresponding to the 1st to 17th columns (n=1, ..., 17) of the base matrix Hb in the 21st row (m=21) of the matrix C belonging to the base matrix Hb may be {−1,117,−1,−1,227,−1,−1,−1,−1,−1,−1,6,−1,−1,−1,−1,−1}.

Elements Vm,n corresponding to the 1st to 17th columns (n=1, ..., 17) of the base matrix Hb in the 22nd row (m=22) of the matrix C belonging to the base matrix Hb may be {238,−1,−1,−1,−1,−1,−1,−1,13,−1,−1,−1,−1,11,−1,−1,−1}.

Elements Vm,n corresponding to the 1st to 17th columns (n=1, ..., 17) of the base matrix Hb in the 23rd row (m=23) of the matrix C belonging to the base matrix Hb may be {−1,195,44,−1,−1,−1,−1,−1,−1,−1,−1,−1,−1,−1,−1,−1,−1}.

Elements Vm,n corresponding to the 1st to 17th columns (n=1, ..., 17) of the base matrix Hb in the 24th row (m=10) of the matrix C belonging to the base matrix Hb may be {5,−1,−1,94,−1,111,−1,−1,−1,−1,−1,−1,−1,−1,−1,−1,−1}.

Elements Vm,n corresponding to the 1st to 17th columns (n=1, ..., 17) of the base matrix Hb in the 25th row (m=25) of the matrix C belonging to the base matrix Hb may be {−1,81,19,−1,−1,−1,−1,−1,−1,130,−1,−1,−1,−1,−1,−1,−1}.

Elements Vm,n corresponding to the 1st to 17th columns (n=1, ..., 17) of the base matrix Hb in the 26th row (m=26) of the matrix C belonging to the base matrix Hb may be {66,−1,−1,−1,−1,95,−1,−1,−1,−1,−1,−1,−1,−1,−1,−1,−1}.

Elements Vm,n corresponding to the 1st to 17th columns (n=1, ..., 17) of the base matrix Hb in the 27th row (m=27) of the matrix C belonging to the base matrix Hb may be {−1,−1,146,−1,−1,−1,−1,66,−1,−1,−1,−1,190,86,−1,−1,−1}.

For reference, a part of the matrix C mentioned in FIG. 7A according to the present embodiment may be as indicated in Table 2.

Elements Vm,n corresponding to the 1st to 17th columns (n=1, ..., 17) of the base matrix Hb in the 31st row (m=31) of the matrix C belonging to the base matrix Hb may be {−1,−1,37,−1,−1,139,−1,221,−1,17,−1,−1,−1,−1,−1,−1,−1}.

Elements Vm,n corresponding to the 1st to 17th columns (n=1, ..., 17) of the base matrix Hb in the 32nd row (m=32) of the matrix C belonging to the base matrix Hb may be {−1,201,−1,−1,−1,−1,−1,−1,−1,−1,−1,−1,−1,46,−1,−1,−1}.

Elements Vm,n corresponding to the 1st to 17th columns (n=1, ..., 17) of the base matrix Hb in the 33rd row (m=33) of the matrix C belonging to the base matrix Hb may be {179,−1,−1,−1,−1,14,−1,−1,−1,−1,−1,−1,116,−1,−1,−1,−1}.

Elements Vm,n corresponding to the 1st to 17th columns (n=1, ..., 17) of the base matrix Hb in the 34th row (m=34) of the matrix C belonging to the base matrix Hb may be {−1,−1,46,−1,−1,−1,−1,2,−1,−1,106,−1,−1,−1,−1,−1,−1}.

Elements Vm,n corresponding to the 1st to 17th columns (n=1, ..., 17) of the base matrix Hb in the 35th row (m=35) of the matrix C belonging to the base matrix Hb may be {184,−1,−1,−1,−1,−1,−1,−1,−1,−1,−1,−1,135,141,−1,−1,−1}.

Elements Vm,n corresponding to the 1st to 17th columns (n=1, ..., 17) of the base matrix Hb in the 36th row (m=36) of the matrix C belonging to the base matrix Hb may be {−1,85,−1,−1,−1,225,−1,−1,−1,−1,−1,175,−1,−1,−1,−1,−1}.

Elements Vm,n corresponding to the 1st to 17th columns (n=1, ..., 17) of the base matrix Hb in the 37th row (m=37) of the matrix C belonging to the base matrix Hb may be {178,−1,112,−1,−1,−1,−1,106,−1,−1,−1,−1,−1,−1,−1,−1,−1}.

Elements Vm,n corresponding to the 1st to 17th columns (n=1, ..., 17) of the base matrix Hb in the 38th row (m=38)

TABLE 2

| −1 | 86 | −1 | −1 | −1 | 186 | −1 | 87 | −1 | −1 | −1 | 172 | −1 | 154 | −1 | −1 | −1 |
|---|---|---|---|---|---|---|---|---|---|---|---|---|---|---|---|---|
| 176 | 169 | −1 | −1 | −1 | −1 | −1 | −1 | −1 | −1 | −1 | −1 | 225 | −1 | −1 | −1 | −1 |
| −1 | 167 | −1 | −1 | −1 | −1 | −1 | −1 | 238 | −1 | 48 | 68 | −1 | −1 | −1 | −1 | −1 |
| 38 | 217 | −1 | −1 | −1 | −1 | 208 | 232 | −1 | −1 | −1 | −1 | −1 | −1 | −1 | −1 | −1 |
| 178 | −1 | −1 | −1 | −1 | −1 | −1 | 214 | −1 | 168 | −1 | −1 | −1 | 51 | −1 | −1 | −1 |
| −1 | 124 | −1 | 122 | −1 | −1 | −1 | −1 | −1 | −1 | −1 | 72 | −1 | −1 | −1 | −1 | −1 |
| 48 | 57 | −1 | −1 | −1 | −1 | −1 | −1 | 167 | −1 | −1 | −1 | −1 | 219 | −1 | −1 | −1 |
| −1 | 82 | −1 | −1 | −1 | −1 | 232 | −1 | −1 | −1 | −1 | 204 | −1 | 162 | −1 | −1 | −1 |
| 38 | −1 | −1 | −1 | −1 | −1 | −1 | −1 | −1 | −1 | 217 | 157 | −1 | −1 | −1 | −1 | −1 |
| −1 | 170 | −1 | −1 | −1 | −1 | −1 | −1 | −1 | 23 | −1 | 175 | 202 | −1 | −1 | −1 | −1 |
| −1 | 196 | −1 | −1 | −1 | 173 | −1 | −1 | −1 | −1 | −1 | 195 | 218 | −1 | −1 | −1 | −1 |
| 128 | −1 | −1 | −1 | −1 | −1 | 211 | 210 | −1 | −1 | −1 | −1 | −1 | −1 | −1 | −1 | −1 |
| 39 | 84 | −1 | −1 | −1 | −1 | −1 | −1 | −1 | −1 | 88 | −1 | −1 | −1 | −1 | −1 | −1 |
| −1 | 117 | −1 | −1 | 227 | −1 | −1 | −1 | −1 | −1 | −1 | 6 | −1 | −1 | −1 | −1 | −1 |
| 238 | −1 | −1 | −1 | −1 | −1 | −1 | −1 | 13 | −1 | −1 | −1 | −1 | 11 | −1 | −1 | −1 |
| −1 | 195 | 44 | −1 | −1 | −1 | −1 | −1 | −1 | −1 | −1 | −1 | −1 | −1 | −1 | −1 | −1 |
| 5 | −1 | −1 | 94 | −1 | 111 | −1 | −1 | −1 | −1 | −1 | −1 | −1 | −1 | −1 | −1 | −1 |
| −1 | 81 | 19 | −1 | −1 | −1 | −1 | −1 | −1 | 130 | −1 | −1 | −1 | −1 | −1 | −1 | −1 |
| 66 | −1 | −1 | −1 | −1 | 95 | −1 | −1 | −1 | −1 | −1 | −1 | −1 | −1 | −1 | −1 | −1 |
| −1 | −1 | 146 | −1 | −1 | −1 | −1 | 66 | −1 | −1 | −1 | −1 | 190 | 86 | −1 | −1 | −1 |

Referring to FIGS. 1 to 6 and FIG. 7B, elements Vm,n corresponding to the 1st to 17th columns (n=1, ..., 17) of the base matrix Hb in the 28th row (m=10) of the matrix C belonging to the base matrix Hb may be {64,−1,−1,−1,−1,−1,1,181,−1,−1,−1,−1,−1,−1,−1,−1,−1}.

Elements Vm,n corresponding to the 1st to 17th columns (n=1, ..., 17) of the base matrix Hb in the 29th row (m=29) of the matrix C belonging to the base matrix Hb may be {−1,7,144,−1,−1,16,−1,−1,−1,−1,−1,−1,−1,−1,−1,−1,−1}.

Elements Vm,n corresponding to the 1st to 17th columns (n=1, ..., 17) of the base matrix Hb in the 30th row (m=30) of the matrix C belonging to the base matrix Hb may be {25,−1,−1,−1,57,−1,−1,−1,−1,−1,−1,−1,−1,−1,−1,−1,−1}.

of the matrix C belonging to the base matrix Hb may be {−1,−1,−1,−1,−1,−1,−1,−1,−1,−1,154,−1,−1,114,−1,−1,−1}.

Elements Vm,n corresponding to the 1st to 17th columns (n=1, ..., 17) of the base matrix Hb in the 39th row (m=39) of the matrix C belonging to the base matrix Hb may be {−1,42,−1,−1,−1,41,−1,−1,−1,−1,−1,105,−1,−1,−1,−1,−1}.

Elements Vm,n corresponding to the 1st to 17th columns (n=1, ..., 17) of the base matrix Hb in the 40th row (m=40) of the matrix C belonging to the base matrix Hb may be {167,−1,−1,−1,−1,−1,−1,45,−1,−1,−1,−1,189,−1,−1,−1,−1}.

Elements Vm,n corresponding to the 1st to 17th columns (n=1, ..., 17) of the base matrix Hb in the 41st row (m=41)

of the matrix C belonging to the base matrix Hb may be {-1,-1,78,-1,-1,-1,-1,-1,-1,-1,67,-1,-1,180,-1,-1,-1}.

Elements Vm,n corresponding to the 1st to 17th columns (n=1, ..., 17) of the base matrix Hb in the 42nd row (m=42) of the matrix C belonging to the base matrix Hb may be {-1,53,-1,-1,-1,215,-1,-1,-1,-1,-1,230,-1,-1,-1,-1,-1}.

For reference, a part of the matrix C mentioned in FIG. 7B according to the present embodiment may be as indicated in Table 3.

TABLE 3

| 64 | -1 | -1 | -1 | -1 | -1 | 181 | -1 | -1 | -1 | -1 | -1 | -1 | -1 | -1 | -1 | -1 |
|---|---|---|---|---|---|---|---|---|---|---|---|---|---|---|---|---|
| -1 | 7 | 144 | -1 | -1 | 16 | -1 | -1 | -1 | -1 | -1 | -1 | -1 | -1 | -1 | -1 | -1 |
| 25 | -1 | -1 | -1 | 57 | -1 | -1 | -1 | -1 | -1 | -1 | -1 | -1 | -1 | -1 | -1 | -1 |
| -1 | -1 | 37 | -1 | -1 | 139 | -1 | 221 | -1 | 17 | -1 | -1 | -1 | -1 | -1 | -1 | -1 |
| -1 | 201 | -1 | -1 | -1 | -1 | -1 | -1 | -1 | -1 | -1 | -1 | -1 | 46 | -1 | -1 | -1 |
| 179 | -1 | -1 | -1 | -1 | 14 | -1 | -1 | -1 | -1 | -1 | -1 | 116 | -1 | -1 | -1 | -1 |
| -1 | -1 | 46 | -1 | -1 | -1 | -1 | 2 | -1 | -1 | 106 | -1 | -1 | -1 | -1 | -1 | -1 |
| 184 | -1 | -1 | -1 | -1 | -1 | -1 | -1 | -1 | -1 | -1 | -1 | 135 | 141 | -1 | -1 | -1 |
| -1 | 85 | -1 | -1 | -1 | 225 | -1 | -1 | -1 | -1 | -1 | 175 | -1 | -1 | -1 | -1 | -1 |
| 178 | -1 | 112 | -1 | -1 | -1 | -1 | 106 | -1 | -1 | -1 | -1 | -1 | -1 | -1 | -1 | -1 |
| -1 | -1 | -1 | -1 | -1 | -1 | -1 | -1 | -1 | -1 | 154 | -1 | -1 | 114 | -1 | -1 | -1 |
| -1 | 42 | -1 | -1 | -1 | 41 | -1 | -1 | -1 | -1 | -1 | 105 | -1 | -1 | -1 | -1 | -1 |
| 167 | -1 | -1 | -1 | -1 | -1 | -1 | 45 | -1 | -1 | -1 | -1 | 189 | -1 | -1 | -1 | -1 |
| -1 | -1 | 78 | -1 | -1 | -1 | -1 | -1 | -1 | -1 | 67 | -1 | -1 | 180 | -1 | -1 | -1 |
| -1 | 53 | -1 | -1 | -1 | 215 | -1 | -1 | -1 | -1 | -1 | 230 | -1 | -1 | -1 | -1 | -1 |

Figure 8A:
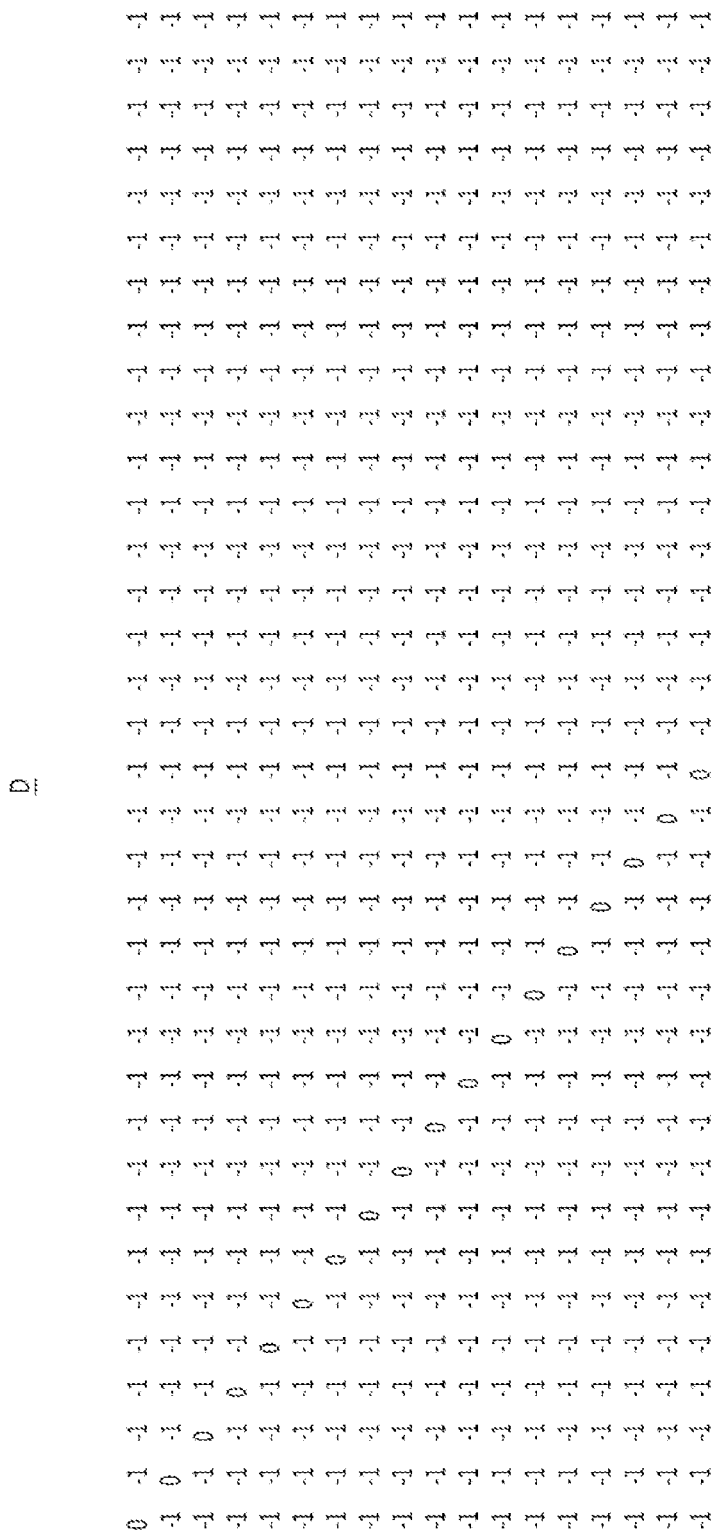
FIGS. 8A and 8B illustrate a matrix C belonging to a base matrix according to an embodiment of the present disclosure.
Figure 8B:

FIGS. 8A and 8B illustrate a matrix D belonging to a base matrix according to an embodiment of the present disclosure.

Referring to FIGS. 1 to 8A, the matrix D belonging to the base matrix Hb may include a plurality of elements corresponding to the 18th to 52nd columns (n=18, ..., 52) of the base matrix Hb in the 8th to 25th rows (m=8, ..., 25) of the base matrix Hb.

Referring to FIGS. 1 to 7 and 8B, the matrix D belonging to the base matrix Hb may include a plurality of elements corresponding to the 18th to 52nd columns (n=18, ..., 52) of the base matrix Hb in the 26th to 42nd rows (m=26, ..., 42) of the base matrix Hb.

18 diagonal elements illustrated in FIG. 8A may be understood as a plurality of elements corresponding to a plurality of locations defined by a plurality of rows (m=8, ..., 25) and a plurality of columns (n=18, ..., 52) satisfying Equation 5 indicated below.

Similarly, 17 diagonal elements illustrated in FIG. 8B may be understood as elements corresponding to locations defined by rows (m=26, ..., 42) and columns (n=18, ..., 52) satisfying Equation 5 indicated below.

$$m+10=n \quad \text{Equation 5}$$

Figure 9:
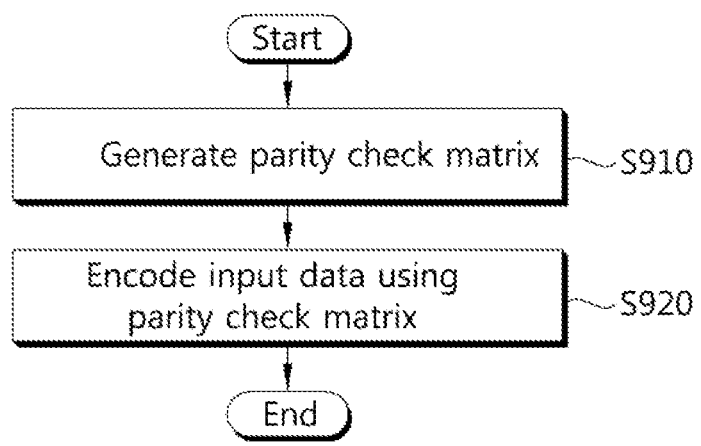
FIG. 9 is a flowchart illustrating a method of performing encoding based on a parity check matrix of an LDPC code according to an embodiment of the present disclosure.

FIG. 9 is a flowchart illustrating a method of performing encoding based on a parity check matrix of an LDPC code according to an embodiment of the present disclosure.

Referring to FIGS. 1 to 9, a UE according to this embodiment may generate the parity check matrix of the LDPC code in step S910.

The parity check matrix according to this embodiment may correspond to a characteristic matrix. The characteristic matrix may include a maximum of 10 information columns for input data.

Each element of the characteristic matrix may correspond to a shift index value determined through a modulo operation between an element of a location corresponding to the element of the characteristic matrix in the base matrix and a lifting value. In addition, the base matrix may be a 42×52 matrix. As described above, the base matrix may be defined as a form as shown in FIG. 5.

In this disclosure, the lifting value may be associated with the length of the input data. In this disclosure, the lifting value may be determined as one of 15, 30, 60, 120, and 240.

The matrix A (i.e., A of FIG. 5) belonging to the base matrix Hb of this disclosure may include a plurality of elements corresponding to the 1st to 17th columns of the base matrix in the 1st to 7th rows of the base matrix. In this case, the plural elements of the matrix A (i.e., A of FIG. 5) may correspond to the elements shown in FIG. 6.

The matrix B (i.e., B of FIG. 5) belonging to the base matrix Hb of this disclosure may include a plurality of elements corresponding to the 18th to 52nd columns of the base matrix in the 1st to 7th rows of the base matrix.

Specifically, all of the elements corresponding to the 18th to 52nd columns of the base matrix in the 1st row of the base matrix Hb may be '−1'. All of the elements corresponding to the 18th to 52nd columns of the base matrix in the second row of the base matrix may be '−1'. All of the elements corresponding to the 18th to 52nd columns of the base matrix in the 3rd row of the base matrix may be '−1'. All of the elements corresponding to the 18th to 52nd columns of the base matrix in the 4th row of the base matrix may be '−1'.

All of the elements corresponding to the 18th to 52nd columns of the base matrix in the 5th row of the base matrix may be '−1'. All of the elements corresponding to the 18th to 52nd columns of the base matrix in the 6th row of the base matrix may be '−1'. All of the elements corresponding to the 18th to 52nd columns of the base matrix in the 7th row of the base matrix may be '−1'.

The matrix C (i.e., C of FIG. 5) belonging to the base matrix Hb of this disclosure may include a plurality of elements corresponding to the 1st to 17th columns of the base matrix in the 8th to 42nd rows of the base matrix. The plural elements of the matrix C (i.e., C of FIG. 5) may correspond to the elements described in FIGS. 7A and 7B.

In the matrix D (i.e., D of FIG. 5) belonging to the base matrix Hb of this disclosure, plural elements corresponding to the 18th to 52nd columns of the base matrix in the 8th to 42nd rows of the base matrix may correspond to all elements of a 35×35 identity matrix.

Notably, the aforementioned modulo operation of Equation 3 may be performed when an element corresponding to the characteristic matrix in the base matrix is an integer equal to or greater than 0.

When a corresponding element in the base matrix is −1, the modulo operation of Equation 3 is not performed and −1 may be determined as an element of the characteristic matrix. In this disclosure, when a corresponding element in the base matrix Hb is '−1', the corresponding element may correspond to a zero matrix.

For example, when the shift index value is '0' or a natural number equal to or greater than '1', each element of the characteristic matrix may correspond to a Zc×Zc identity matrix. All elements of the identity matrix may be shifted to the right according to the shift index value.

In step S920, the UE according to the present embodiment may encode the input data using the parity check matrix.

If the present embodiment described with reference to FIGS. 1 to 9 is applied, when the shift index value of the characteristic matrix of FIG. 4 is changed according to the length of information bits based on a single base matrix of FIG. 5, the parity check matrix (e.g., FIG. 3) of an LDPC code having high reliability in terms of latency can be obtained.

Figure 10:
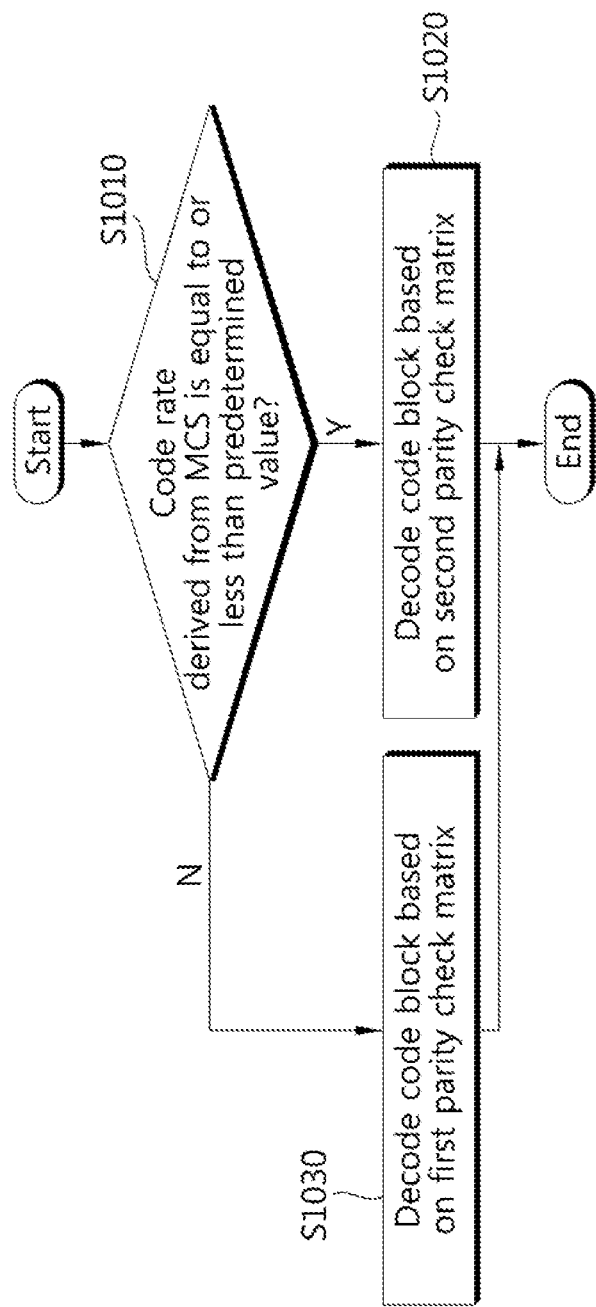
FIG. 10 is a flowchart illustrating a method of performing a decoding procedure for a transport block based on any one of parity check matrices of two types according to another embodiment of the present disclosure.

FIG. 10 is a flowchart illustrating a method of performing a decoding procedure for a transport block based on any one of parity check matrices of two types according to another embodiment of the present disclosure.

According to the embodiment of FIG. 10, a first parity check matrix may be defined based on a base matrix having a size of 46×68. For example, the first parity check matrix may have a first maximum information bit value (e.g., 8448).

According to the embodiment of FIG. 10, a second parity check matrix may be defined based on a base matrix having a size of 42×52. For example, the second parity check matrix may have a second maximum information bit value (e.g., 3840). In this case, it may be understood that the second parity check matrix based on the base matrix having a size of 42×52 is based on the above description given with reference to FIGS. 1 to 9.

In the present disclosure, the first parity check matrix or the second parity check matrix may be determined according to a predetermined rule during initial transmission of a transport block (TB) having a code rate R and retransmission of the same TB.

In step S1010, the UE may determine whether the code rate R derived from a modulation and coding scheme (MCS) index according to received downlink control information (DCI) is equal to or less than a predetermined value (e.g., 0.25). If the code rate R derived from the MCS index is equal to or less than the predetermined value, step S1020 may be performed.

In step S1020, the UE may decode a code block (CB) based on the second parity check matrix based on the base matrix having a size of 42×52.

If it is determined that the code rate R derived from the MCS index exceeds the predetermined value in step S1010, step S1030 may be performed.

In step S1030, the UE may decode the CB based on the first parity check matrix based on the base matrix having a size of 46×68.

Which of the first parity check matrix and the second parity check matrix is used as a parity check matrix for an encoding or decoding procedure by the UE may differ according to a code rate, a TBS, a CB size, a service type provided to the UE, or a type of a partial band on which the UE receives a signal.

Figure 11:
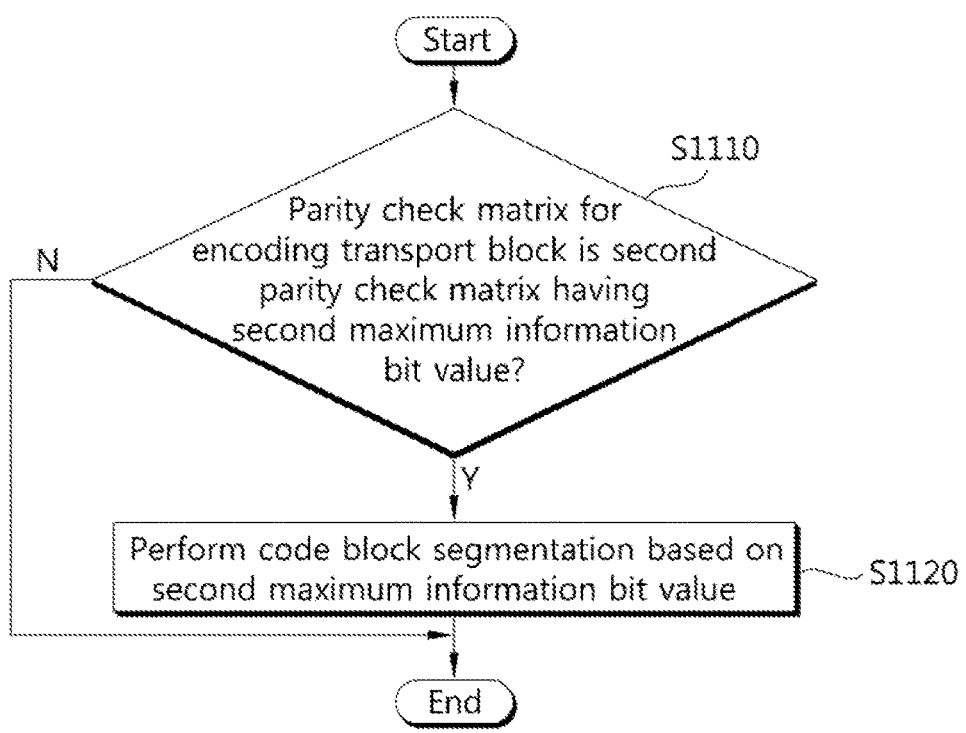
FIG. 11 is a flowchart illustrating a method of performing code block segmentation based on a parity check matrix of an LDPC accord to another embodiment of the present disclosure.

FIG. 11 is a flowchart illustrating a method of performing CB segmentation based on a parity check matrix of an LDPC accord to another embodiment of the present disclosure.

According to the embodiment of FIG. 11, a first parity check matrix may be defined based on a base matrix having a size of 46×68. The first parity check matrix may have a first maximum information bit value (e.g., 8448). For example, the first maximum information bit value (e.g., 8448) may represent the length of input data capable of being encoded based on the first parity check matrix.

According to the embodiment of FIG. 11, a second parity check matrix may be defined based on a base matrix having a size of 42×52. The second parity check matrix may have a second maximum information bit value (e.g., 3840). For example, the second maximum information bit value (e.g., 3840) may represent the length of input data capable of being encoded based on the second parity check matrix.

In this case, the second parity check matrix based on the base matrix having a size of 42×52 may be understood based on the above description given with reference to FIGS. 1 to 9.

Referring to FIGS. 10 and 11, in step S1110, a UE may determine, based on a code rate for a TB, any one of the first parity check matrix having the first maximum information bit value and the second parity check matrix having the second maximum information bit value as a parity check matrix for encoding the TB.

To simplify and clarify a description of FIG. 10, it may be assumed that the code rate for the TB is equal to or less than a predetermined value (e.g., 0.25). According to the above assumption, the UE may determine the second parity check matrix as the parity check matrix for encoding the TB.

If the second parity check matrix is determined as the parity check matrix, the procedure proceeds to step S1120. Although not shown in FIG. 11, if the second parity check matrix is determined as the parity check matrix, the UE may add a second cyclic redundancy check (CRC) of 16 bits to the TB.

If the first parity check matrix is determined as the parity check matrix, the procedure may be ended. Although not shown in FIG. 11, if the first parity check matrix is determined as the parity check matrix, the UE may add a first CRC of 24 bits to the TB.

In S1120, the UE may perform CB segmentation for the TB based on the second maximum information bit value of the second parity check matrix. For example, if CB segmentation is performed, at least two CBs may be obtained from the TB. Code block segmentation of step S1120 may be performed based on the second maximum information bit value even if the length of the TB exceeds the first maximum information bit value.

For example, the UE may identify whether the first parity check matrix is applied or the second parity check matrix is applied according to a pre-agreed rule between the UE and a base station. Next, the UE may determine whether a CRC applied to a CB and/or a TB is a first type CRC or a second type CRC, based on the identified result.

In the above example, if the code rate is derived during uplink transmission, resource elements (REs) occupied by multiplexed information such as a channel quality indicator (CQI) may be excluded from a calculation process of the code rate. In addition, a code rate applied to each CB may be calculated in a state in which REs occupied by punctured information such as ACK/NACK are considered.

Figure 12:
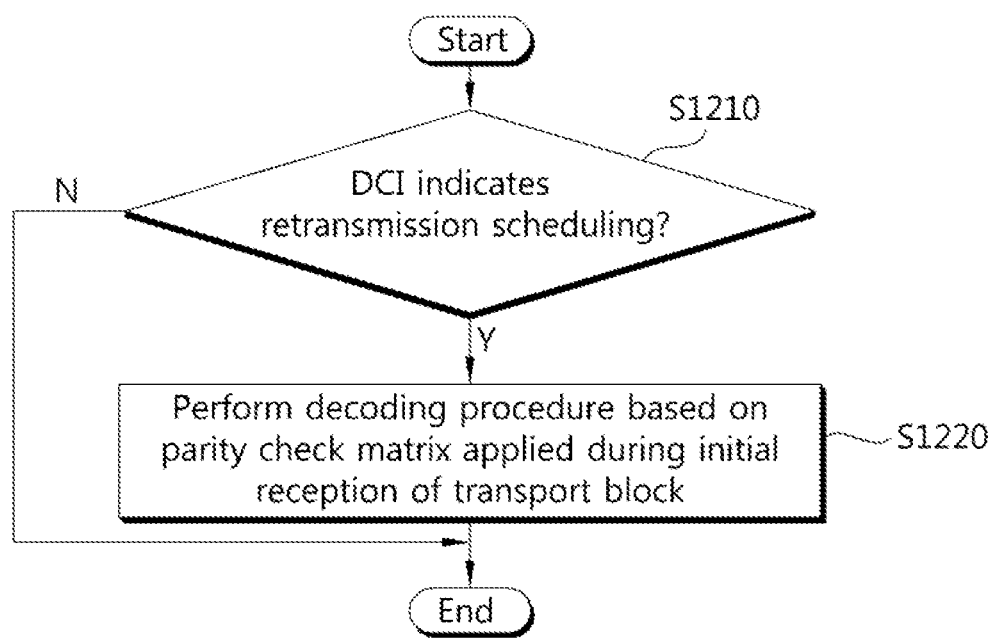
FIG. 12 is a flowchart illustrating a method of performing a decoding procedure based on a parity check matrix according to another embodiment of the present disclosure.

FIG. 12 is a flowchart illustrating a method of performing a decoding procedure based on a parity check matrix according to another embodiment of the present disclosure.

According to the embodiment of FIG. 12, a first parity check matrix based on a base matrix having a size of 46×68 may be defined. For example, the first parity check matrix may have a first maximum information bit value (e.g., 8448).

According to the embodiment of FIG. 12, a second check matrix based on a base matrix having a size of 42×52 may be defined. For example, the second parity check matrix may have a second maximum information bit value (e.g., 3840). In this case, it may be understood that the second parity check matrix based on the base matrix having a size of 42×52 is based on the above description given with reference to FIGS. 1 to 9.

Referring to FIGS. 10 to 12, in step S1210, the UE may determine whether DCI indicates retransmission scheduling. If the DCI does not indicate retransmission scheduling, the procedure may be ended. If the DCI indicates retransmission scheduling (i.e., when a new data indicator is not toggled or the new data indicator is set to '0'), the procedure proceeds to step S1220.

In step S1220, the UE may perform the decoding procedure based on the parity check matrix which has been applied during initial reception of a TB. In this case, the parity check matrix may be the first parity check matrix or the second parity check matrix.

Specifically, the UE may perform the decoding procedure based on a parity check matrix corresponding to the case in which a TB mapped to a retransmission process ID is first received (i.e., the case in which the new data indicator is toggled or the new data indicator is set to '1').

The invention claimed is:

1. A method of encoding information, by a transmitting device using a parity check matrix of a low-density parity-check code, for transmission over a communication channel, the method comprising:
   determining, by the transmitting device, the parity check matrix of dimensions at least 7Z rows and 17Z columns comprising 7 rows and 17 columns of Z×Z-sized submatrices that are indexed by submatrix row index m (where 0≤m≤6) and submatrix column index n (where 0≤n≤16), wherein Z is a non-zero integer, and wherein:
     for submatrix row index m=0 and for submatrix column indices n={0, 1, 2, 3, 6, 9, 10, 11}, each submatrix at submatrix index (m, n) is obtained based on a respective value among {145, 131, 71, 21, 23, 112, 1, 0},
     for submatrix row index m=1 and for submatrix column indices n={0, 3, 4, 5, 6, 7, 8, 9, 11, 12}, each submatrix at submatrix index (m, n) is obtained based on a respective value among {142, 174, 183, 27, 96, 23, 9, 167, 0, 0},
     for submatrix row index m=2 and for submatrix column indices n={0, 1, 3, 4, 8, 10, 12, 13}, each submatrix at submatrix index (m, n) is obtained based on a respective value among {74, 31, 3, 53, 155, 0, 0, 0},
     for submatrix row index m=3 and for submatrix column indices n={1, 2, 4, 5, 6, 7, 8, 9, 10, 13}, each submatrix at submatrix index (m, n) is equal to a circularly column-shifted identity matrix of size Z×Z that is obtained based on a respective value among {239, 171, 95, 110, 159, 199, 43, 75, 1, 0},
     for submatrix row index m=4 and for submatrix column indices n={0, 1, 11, 14}, each submatrix at submatrix index (m, n) is obtained based on a respective value among {29, 140, 180, 0},
     for submatrix row index m=5 and for submatrix column indices n={0, 1, 5, 7, 11, 15}, each submatrix at submatrix index (m, n) is obtained based on a respective value among {121, 41, 169, 88, 207, 0}, and
     for submatrix row index m=6 and for submatrix column indices n={0, 5, 7, 9, 11, 16}, each submatrix at submatrix index (m, n) is obtained based on a respective value among {137, 72, 172, 124, 56, 0},
   generating encoded data, by the transmitting device, based on encoding the information with the determined parity check matrix; and
   transmitting, by a transceiver of the transmitting device, the encoded data over the communication channel.

2. The method according to claim 1, wherein in each of the submatrix row indices m=0, . . . , 6, the each submatrix at submatrix index (m, n) is obtained further based on a value of Z.

3. The method according to claim 1, wherein
   for submatrix row index m=0 and for submatrix column indices other than n={0, 1, 2, 3, 6, 9, 10, 11}, each submatrix at submatrix index (m, n) is equal to an all-zero matrix of size Z×Z,
   for submatrix row index m=1 and for submatrix column indices other than n={0, 3, 4, 5, 6, 7, 8, 9, 11, 12}, each submatrix at submatrix index (m, n) is equal to an all-zero matrix of size Z×Z,
   for submatrix row index m=2 and for submatrix column indices other than n={0, 1, 3, 4, 8, 10, 12, 13}, each submatrix at submatrix index (m, n) is equal to an all-zero matrix of size Z×Z,
   for submatrix row index m=3 and for submatrix column indices other than n={1, 2, 4, 5, 6, 7, 8, 9, 10, 13}, each submatrix at submatrix index (m, n) is equal to an all-zero matrix of size Z×Z,
   for submatrix row index m=4 and for submatrix column indices other than n={0, 1, 11, 14}, each submatrix at submatrix index (m, n) is equal to an all-zero matrix of size Z×Z,
   for submatrix row index m=5 and for submatrix column indices other than n={0, 1, 5, 7, 11, 15}, each submatrix at submatrix index (m, n) is equal to an all-zero matrix of size Z×Z, and
   for submatrix row index m=6 and for submatrix column indices other than n={0, 5, 7, 9, 11, 16}, each submatrix at submatrix index (m, n) is equal to an all-zero matrix of size Z×Z.

4. The method according to claim 1, wherein the parity check matrix has dimensions of 42Z rows comprising 42 rows of Z×Z-sized submatrices that are indexed by submatrix row index m (where 0≤m≤41), and
   wherein:
     for submatrix row index m=7 and for submatrix column indices n={1, 5, 7, 11, 13}, each submatrix at submatrix index (m, n) is obtained based on a respective value among {86, 186, 87, 172, 154},
     for submatrix row index m=8 and for submatrix column indices n={0, 1, 12}, each submatrix at submatrix index (m, n) is obtained based on a respective value among {176, 169, 225},
     for submatrix row index m=9 and for submatrix column indices n={1, 8, 10, 11}, each submatrix at submatrix index (m, n) is obtained based on a respective value among {167, 238, 48, 68},
     for submatrix row index m=10 and for submatrix column indices n={0, 1, 6, 7}, each submatrix at submatrix index (m, n) is obtained based on a respective value among {38, 217, 208, 232},
     for submatrix row index m=11 and for submatrix column indices n={0, 7, 9, 13}, each submatrix at submatrix index (m, n) is obtained based on a respective value among {178, 214, 168, 51},
     for submatrix row index m=12 and for submatrix column indices n={1, 3, 11}, each submatrix at submatrix index (m, n) is obtained based on a respective value among {124, 122, 72}, for submatrix row index m=13 and for submatrix column indices n={0, 1, 8, 13}, each submatrix at submatrix index (m, n) is obtained based on a respective value among {48, 57, 167, 219}, for submatrix row index m=14 and for submatrix column indices n={1, 6, 11, 13}, each submatrix at submatrix index (m, n) is obtained based on a respective value among {82, 232, 204, 162}, for submatrix row index m=15 and for submatrix column indices n={0, 10, 11}, each submatrix at submatrix index (m, n) is obtained based on a respective value among {38, 217, 157}, for submatrix row index m=16 and for submatrix column indices n={1, 9, 11, 12}, each submatrix at submatrix index (m, n) is obtained based on a respective value among {170, 23, 175, 202}, for submatrix row index m=17 and for submatrix column indices n={1, 5, 11, 12}, each submatrix at submatrix index (m, n) is obtained based on a respective value among {196, 173, 195, 218}, for submatrix row index m=18 and for submatrix column indices n={0, 6, 7}, each submatrix at submatrix index (m, n) is obtained based on a respective value among {128, 211, 210}, for submatrix row index m=19 and for submatrix column indices n={0, 1, 10}, each submatrix at submatrix index (m, n) is obtained based on a respective value among {39, 84, 88}, for submatrix row index m=20 and for submatrix column indices n={1, 4, 11}, each submatrix at submatrix index (m, n) is obtained based on a respective value among {117, 227, 6}, for submatrix row index m=21 and for submatrix column indices n={0, 8, 13}, each submatrix at submatrix index (m, n) is obtained based on a respective value among {238, 13, 11}, for submatrix row index m=22 and for submatrix column indices n={1, 2}, each submatrix at submatrix index (m, n) is obtained based on a respective value among {195, 44}, for submatrix row index m=23 and for submatrix column indices n={0, 3, 5}, each submatrix at submatrix index (m, n) is obtained based on a respective value among {5, 94, 111}, for submatrix row index m=24 and for submatrix column indices n={1, 2, 9}, each submatrix at submatrix index (m, n) is obtained based on a respective value among {81, 19, 130}, for submatrix row index m=25 and for submatrix column indices n={0, 5}, each submatrix at submatrix index (m, n) is obtained based on a respective value among {66, 95}, for submatrix row index m=26 and for submatrix column indices n={3, 8, 13, 14}, each submatrix at submatrix index (m, n) is obtained based on a respective value among {146, 66, 190, 86}, for submatrix row index m=27 and for submatrix column indices n={0, 6}, each submatrix at submatrix index (m, n) is obtained based on a respective value among {64, 181}, for submatrix row index m=28 and for submatrix column indices n={1, 2, 5}, each submatrix at submatrix index (m, n) is obtained based on a respective value among {7, 144, 16}, for submatrix row index m=29 and for submatrix column indices n={0, 4}, each submatrix at submatrix index (m, n) is obtained based on a respective value among {25, 57}, for submatrix row index m=30 and for submatrix column indices n={2, 5, 7, 9}, each submatrix at submatrix index (m, n) is obtained based on a respective value among {37, 139, 221, 17}, for submatrix row index m=31 and for submatrix column indices n={1, 13}, each submatrix at submatrix index (m, n) is obtained based on a respective value among {201, 46}, for submatrix row index m=32 and for submatrix column indices n={0, 5, 12}, each submatrix at submatrix index (m, n) is obtained based on a respective value among {179, 14, 116}, for submatrix row index m=33 and for submatrix column indices n={2, 7, 10}, each submatrix at submatrix index (m, n) is obtained based on a respective value among {46, 2, 106}, for submatrix row index m=34 and for submatrix column indices n={0, 12, 13}, each submatrix at submatrix index (m, n) is obtained based on a respective value among {184, 135, 141}, for submatrix row index m=35 and for submatrix column indices n={1, 5, 11}, each submatrix at submatrix index (m, n) is obtained based on a respective value among {85, 225, 175}, for submatrix row index m=36 and for submatrix column indices n={0, 2, 7}, each submatrix at submatrix index (m, n) is obtained based on a respective value among {178, 112, 106}, for submatrix row index m=37 and for submatrix column indices n={10, 13}, each submatrix at submatrix index (m, n) is obtained based on a respective value among {154, 114}, for submatrix row index m=38 and for submatrix column indices n={1, 5, 11}, each submatrix at submatrix index (m, n) is obtained based on a respective value among {42, 41, 105}, for submatrix row index m=39 and for submatrix column indices n={0, 7, 12}, each submatrix at submatrix index (m, n) is obtained based on a respective value among {167, 45, 189}, for submatrix row index m=40 and for submatrix column indices n={2, 10, 13}, each submatrix at submatrix index (m, n) is obtained based on a respective value among {78, 67, 180}, and for submatrix row index m=41 and for submatrix column indices n={1, 5, 11}, each submatrix at submatrix index (m, n) is obtained based on a respective value among {53, 215, 230}.

5. The method according to claim 4, wherein in each of the submatrix row indices m=7, . . . , 41, the each submatrix at submatrix index (m, n) is obtained further based on a value of Z.

6. The method according to claim 1, wherein the parity check matrix has dimensions of at least 42Z rows and 52Z columns comprising 42 rows and 52 columns of Z×Z-sized submatrices that are indexed by submatrix row index m (where $0 \leq m \leq 41$) and submatrix column index n (where $0 \leq n \leq 51$), wherein for submatrix row indices m=7, . . . , 41 and submatrix column indices n=17, . . . , 51:

each submatrix along the 35 diagonal elements at submatrix index (m, m+10) is an un-shifted identity matrix of size Z×Z, and each submatrix except for those along the 35 diagonal elements is an all-zero matrix of size Z×Z.

7. The method according to claim 1, wherein generating the encoded data, by the transmitting device, based on encoding the information with the determined parity check matrix comprises:

generating, based on the information and the parity check matrix, a plurality of parity bits $\vec{p}$ that satisfy:

$$H \cdot (\vec{x}\ \vec{p})^T = 0,$$

where H is the parity check matrix, and $\vec{x}$ is the information.

8. The method according to claim 1, wherein in each of the submatrix row indices m=0, . . . , 6, the each submatrix at submatrix index (m, n) is equal to a circularly column-shifted identity matrix of size Z×Z that is circularly column-shifted to the right.

9. The method according to claim 1, wherein the Z of each submatrix is related to a size of the information that is encoded by the transmitting device.

10. The method according to claim 9, wherein the Z represents a lifting value that is any one of 15, 30, 60, 120, or 240, and wherein the size of the information is 10 times Z.

11. The method according to claim 1, further comprising: determining a base matrix of size at least 7×17 in which an element at location (m, n) of the base matrix indicates whether the submatrix at submatrix index (m, n) is equal to a circularly column-shifted identity matrix of size Z×Z that is circularly column-shifted to the right.

12. The method according to claim 1, further comprising: determining, by the transmitting device, a modulation and coding scheme (MCS) index according to downlink control information received by the transmitting device;

deriving, by the transmitting device and from the MCS index, a code rate;

determining, by the transmitting device, that the code rate does not satisfy a threshold criterion; and based on a determination that the code rate does not satisfy the threshold criterion, determining the parity check matrix of dimensions at least 7Z rows and 17Z columns and performing encoding on the information using the parity check matrix to generate the encoded data.

13. A transmitting device configured to encode, based on a parity check matrix of a low-density parity-check code, information for transmission over a communication channel, the transmitting device comprising:

at least one processor; and at least one computer memory operably connectable to the at least one processor and storing instructions that, when executed, cause the at least one processor to perform operations comprising:

determining the parity check matrix of dimensions at least 7Z rows and 17Z columns comprising 7 rows and 17 columns of Z×Z-sized submatrices that are indexed by submatrix row index m (where 0≤m≤6) and submatrix column index n (where 0≤n≤16), wherein Z is a non-zero integer, and wherein:

for submatrix row index m=0 and for submatrix column indices n={0, 1, 2, 3, 6, 9, 10, 11}, each submatrix at submatrix index (m, n) is obtained based on a respective value among {145, 131, 71, 21, 23, 112, 1, 0}, for submatrix row index m=1 and for submatrix column indices n={0, 3, 4, 5, 6, 7, 8, 9, 11, 12}, each submatrix at submatrix index (m, n) is obtained based on a respective value among {142, 174, 183, 27, 96, 23, 9, 167, 0, 0}, for submatrix row index m=2 and for submatrix column indices n={0, 1, 3, 4, 8, 10, 12, 13}, each submatrix at submatrix index (m, n) is obtained based on a respective value among {74, 31, 3, 53, 155, 0, 0, 0}, for submatrix row index m=3 and for submatrix column indices n={1, 2, 4, 5, 6, 7, 8, 9, 10, 13}, each submatrix at submatrix index (m, n) is equal to a circularly column-shifted identity matrix of size Z×Z that is obtained based on a respective value among {239, 171, 95, 110, 159, 199, 43, 75, 1, 0}, for submatrix row index m=4 and for submatrix column indices n={0, 1, 11, 14}, each submatrix at submatrix index (m, n) is obtained based on a respective value among {29, 140, 180, 0}, for submatrix row index m=5 and for submatrix column indices n={0, 1, 5, 7, 11, 15}, each submatrix at submatrix index (m, n) is obtained based on a respective value among {121, 41, 169, 88, 207, 0}, and for submatrix row index m=6 and for submatrix column indices n={0, 5, 7, 9, 11, 16}, each submatrix at submatrix index (m, n) is obtained based on a respective value among {137, 72, 172, 124, 56, 0}, generating encoded data based on encoding the information with the determined parity check matrix; and transmitting the encoded data.

14. The transmitting device according to claim 13, wherein in each of the submatrix row indices m=0, . . . , 6, the each submatrix at submatrix index (m, n) is obtained further based on a value of Z.

15. The transmitting device according to claim 13, wherein for submatrix row index m=0 and for submatrix column indices other than n={0, 1, 2, 3, 6, 9, 10, 11}, each submatrix at submatrix index (m, n) is equal to an all-zero matrix of size Z×Z, for submatrix row index m=1 and for submatrix column indices other than n={0, 3, 4, 5, 6, 7, 8, 9, 11, 12}, each submatrix at submatrix index (m, n) is equal to an all-zero matrix of size Z×Z, for submatrix row index m=2 and for submatrix column indices other than n={0, 1, 3, 4, 8, 10, 12, 13}, each submatrix at submatrix index (m, n) is equal to an all-zero matrix of size Z×Z, for submatrix row index m=3 and for submatrix column indices other than n={1, 2, 4, 5, 6, 7, 8, 9, 10, 13}, each submatrix at submatrix index (m, n) is equal to an all-zero matrix of size Z×Z, for submatrix row index m=4 and for submatrix column indices other than n={0, 1, 11, 14}, each submatrix at submatrix index (m, n) is equal to an all-zero matrix of size Z×Z, for submatrix row index m=5 and for submatrix column indices other than n={0, 1, 5, 7, 11, 15}, each submatrix at submatrix index (m, n) is equal to an all-zero matrix of size Z×Z, and for submatrix row index m=6 and for submatrix column indices other than n={0, 5, 7, 9, 11, 16}, each submatrix at submatrix index (m, n) is equal to an all-zero matrix of size Z×Z.

16. The method according to claim 1, wherein the parity check matrix has dimensions of 42Z rows comprising 42 rows of Z×Z-sized submatrices that are indexed by submatrix row index m (where 0≤m≤41), and
wherein:
for submatrix row index m=7 and for submatrix column indices n={1, 5, 7, 11, 13}, each submatrix at submatrix index (m, n) is obtained based on a respective value among {86, 186, 87, 172, 154},
for submatrix row index m=8 and for submatrix column indices n={0, 1, 12}, each submatrix at submatrix index (m, n) is obtained based on a respective value among {176, 169, 225},
for submatrix row index m=9 and for submatrix column indices n={1, 8, 10, 11}, each submatrix at submatrix index (m, n) is obtained based on a respective value among {167, 238, 48, 68},
for submatrix row index m=10 and for submatrix column indices n={0, 1, 6, 7}, each submatrix at submatrix index (m, n) is obtained based on a respective value among {38, 217, 208, 232},
for submatrix row index m=11 and for submatrix column indices n={0, 7, 9, 13}, each submatrix at submatrix index (m, n) is obtained based on a respective value among {178, 214, 168, 51},
for submatrix row index m=12 and for submatrix column indices n={1, 3, 11}, each submatrix at submatrix index (m, n) is obtained based on a respective value among {124, 122, 72},
for submatrix row index m=13 and for submatrix column indices n={0, 1, 8, 13}, each submatrix at submatrix index (m, n) is obtained based on a respective value among {48, 57, 167, 219},
for submatrix row index m=14 and for submatrix column indices n={1, 6, 11, 13}, each submatrix at submatrix index (m, n) is obtained based on a respective value among {82, 232, 204, 162},
for submatrix row index m=15 and for submatrix column indices n={0, 10, 11}, each submatrix at submatrix index (m, n) is obtained based on a respective value among {38, 217, 157},
for submatrix row index m=16 and for submatrix column indices n={1, 9, 11, 12}, each submatrix at submatrix index (m, n) is obtained based on a respective value among {170, 23, 175, 202},
for submatrix row index m=17 and for submatrix column indices n={1, 5, 11, 12}, each submatrix at submatrix index (m, n) is obtained based on a respective value among {196, 173, 195, 218},
for submatrix row index m=18 and for submatrix column indices n={0, 6, 7}, each submatrix at submatrix index (m, n) is obtained based on a respective value among {128, 211, 210},
for submatrix row index m=19 and for submatrix column indices n={0, 1, 10}, each submatrix at submatrix index (m, n) is obtained based on a respective value among {39, 84, 88},
for submatrix row index m=20 and for submatrix column indices n={1, 4, 11}, each submatrix at submatrix index (m, n) is obtained based on a respective value among {117, 227, 6},
for submatrix row index m=21 and for submatrix column indices n={0, 8, 13}, each submatrix at submatrix index (m, n) is obtained based on a respective value among {238, 13, 11},
for submatrix row index m=22 and for submatrix column indices n={1, 2}, each submatrix at submatrix index (m, n) is obtained based on a respective value among {195, 44},
for submatrix row index m=23 and for submatrix column indices n={0, 3, 5}, each submatrix at submatrix index (m, n) is obtained based on a respective value among {5, 94, 111},
for submatrix row index m=24 and for submatrix column indices n={1, 2, 9}, each submatrix at submatrix index (m, n) is obtained based on a respective value among {81, 19, 130},
for submatrix row index m=25 and for submatrix column indices n={0, 5}, each submatrix at submatrix index (m, n) is obtained based on a respective value among {66, 95},
for submatrix row index m=26 and for submatrix column indices n={3, 8, 13, 14}, each submatrix at submatrix index (m, n) is obtained based on a respective value among {146, 66, 190, 86},
for submatrix row index m=27 and for submatrix column indices n={0, 6}, each submatrix at submatrix index (m, n) is obtained based on a respective value among {64, 181},
for submatrix row index m=28 and for submatrix column indices n={1, 2, 5}, each submatrix at submatrix index (m, n) is obtained based on a respective value among {7, 144, 16},
for submatrix row index m=29 and for submatrix column indices n={0, 4}, each submatrix at submatrix index (m, n) is obtained based on a respective value among {25, 57},
for submatrix row index m=30 and for submatrix column indices n={2, 5, 7, 9}, each submatrix at submatrix index (m, n) is obtained based on a respective value among {37, 139, 221, 17},
for submatrix row index m=31 and for submatrix column indices n={1, 13}, each submatrix at submatrix index (m, n) is obtained based on a respective value among {201, 46},
for submatrix row index m=32 and for submatrix column indices n={0, 5, 12}, each submatrix at submatrix index (m, n) is obtained based on a respective value among {179, 14, 116},
for submatrix row index m=33 and for submatrix column indices n={2, 7, 10}, each submatrix at submatrix index (m, n) is obtained based on a respective value among {46, 2, 106},
for submatrix row index m=34 and for submatrix column indices n={0, 12, 13}, each submatrix at submatrix index (m, n) is obtained based on a respective value among {184, 135, 141},
for submatrix row index m=35 and for submatrix column indices n={1, 5, 11}, each submatrix at submatrix index (m, n) is obtained based on a respective value among {85, 225, 175},
for submatrix row index m=36 and for submatrix column indices n={0, 2, 7}, each submatrix at submatrix index (m, n) is obtained based on a respective value among {178, 112, 106},
for submatrix row index m=37 and for submatrix column indices n={10, 13}, each submatrix at submatrix index (m, n) is obtained based on a respective value among {154, 114},
for submatrix row index m=38 and for submatrix column indices n={1, 5, 11}, each submatrix at submatrix index (m, n) is obtained based on a respective value among {42, 41, 105}, for submatrix row index m=39 and for submatrix column indices n={0, 7, 12}, each submatrix at submatrix index (m, n) is obtained based on a respective value among {167, 45, 189}, for submatrix row index m=40 and for submatrix column indices n={2, 10, 13}, each submatrix at submatrix index (m, n) is obtained based on a respective value among {78, 67, 180}, and for submatrix row index m=41 and for submatrix column indices n={1, 5, 11}, each submatrix at submatrix index (m, n) is obtained based on a respective value among {53, 215, 230}.

17. The transmitting device according to claim 13, wherein the parity check matrix has dimensions of at least 42Z rows and 52Z columns comprising 42 rows and 52 columns of Z×Z-sized submatrices that are indexed by submatrix row index m (where 0≤m≤41) and submatrix column index n (where 0≤n≤51), wherein for submatrix row indices m=7, ... , 41 and submatrix column indices n=17, ... , 51:

each submatrix along the 35 diagonal elements at submatrix index (m, m+10) is an un-shifted identity matrix of size Z×Z, and each submatrix except for those along the 35 diagonal elements is an all-zero matrix of size Z×Z.

18. The transmitting device according to claim 13, wherein in each of the submatrix row indices m=0, ... , 6, the each submatrix at submatrix index (m, n) is equal to a circularly column-shifted identity matrix of size Z×Z that is circularly column-shifted to the right.

19. The transmitting device according to claim 13, wherein the Z of each submatrix is related to a size of the information that is encoded by the transmitting device.

20. The transmitting device according to claim 19, wherein the Z represents a lifting value that is any one of 15, 30, 60, 120, or 240, and wherein the size of the information is 10 times Z.

* * * * *